(12) United States Patent
Cho et al.

(10) Patent No.: US 10,249,835 B2
(45) Date of Patent: Apr. 2, 2019

(54) DISPLAY DEVICE AND PORTABLE TERMINAL

(71) Applicant: SAMSUNG DISPLAY CO., LTD., Yongin, Gyeonggi-do (KR)

(72) Inventors: Seongheon Cho, Yongin-si (KR); Ahyoung Son, Seoul (KR); Heesoon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 15/241,028

(22) Filed: Aug. 18, 2016

(65) Prior Publication Data
US 2017/0124944 A1    May 4, 2017

(30) Foreign Application Priority Data

Nov. 4, 2015   (KR) .................. 10-2015-0154608

(51) Int. Cl.
*G06F 1/16* (2006.01)
*H04M 1/02* (2006.01)
(Continued)

(52) U.S. Cl.
CPC ........ *H01L 51/0096* (2013.01); *G06F 1/1637* (2013.01); *G06F 3/044* (2013.01);
(Continued)

(58) Field of Classification Search
CPC ............... G09G 3/3225; G09G 3/3275; G09G 2300/04; G09G 2380/02; G06F 3/0412; G06F 3/044; G06F 1/1637; G06F 1/1626; H04M 1/0277; H04M 1/0266; H01L 51/5253; H01L 51/0096; H01L 27/3276
See application file for complete search history.

(56) References Cited

U.S. PATENT DOCUMENTS

| 2002/0140654 A1* | 10/2002 | Kim ................... G02F 1/13452 345/87 |
| 2015/0212549 A1* | 7/2015 | Shin .................. G02F 1/133308 361/679.26 |
| 2015/0295614 A1* | 10/2015 | Michino ............... G06F 1/1637 455/575.8 |

FOREIGN PATENT DOCUMENTS

| JP | 08-250279 | 7/1998 |
| KR | 10-2005-0014134 | 2/2005 |

(Continued)

OTHER PUBLICATIONS

English Abstract of JP 08-250279, corresponding to JP 08-250279.

*Primary Examiner* — Srilakshmi K Kumar
*Assistant Examiner* — Brent D Castiaux
(74) *Attorney, Agent, or Firm* — Lewis Roca Rothgerber Christie LLP

(57) ABSTRACT

A display device includes a display panel having a first portion, a second portion extending from the first portion, and a third portion extending from the second portion and facing the first portion; a body configured to be located between the first and third portions and being configured to be coupled to the display panel in a first state or in a second state or to be separated from the display panel, the body including four peripheral surfaces; a driver configured to drive the display panel; and a printed circuit board configured to apply a signal to the driver to drive the display panel, wherein the display panel covers the different surfaces of the body in the first state and in the second state.

19 Claims, 10 Drawing Sheets

(51) Int. Cl.
*G06F 3/041* (2006.01)
*G06F 3/044* (2006.01)
*H01L 51/00* (2006.01)
*H01L 27/32* (2006.01)

(52) U.S. Cl.
CPC ........ *G06F 3/0412* (2013.01); *H04M 1/0266* (2013.01); *H04M 1/0277* (2013.01); *G06F 1/1626* (2013.01); *H01L 27/3276* (2013.01)

(56) References Cited

FOREIGN PATENT DOCUMENTS

| KR | 10-0612506 | 8/2006 |
| KR | 10-2015-0015268 | 2/2015 |
| KR | 10-2015-0037196 | 4/2015 |
| KR | 10-2015-0066313 | 6/2015 |

* cited by examiner

DISPLAY DEVICE AND PORTABLE TERMINAL

CROSS-REFERENCE TO RELATED APPLICATION

This U.S. non-provisional patent application claims priority to and the benefit of Korean Patent Application No. 10-2015-0154608, filed on Nov. 4, 2015, the entire content of which is hereby incorporated by reference.

BACKGROUND

1. Field

The present disclosure relates to a display device and a portable terminal.

2. Description of the Related Art

In recent years, various display devices, which are applied to a multimedia device, such as a television set, a mobile phone, a navigation unit, a computer monitor, a game unit, etc., have been developed. The display devices provide a user with an image having predetermined information. The display devices generally each include an area in which the image is displayed (display area) and an area in which the image is not displayed (non-display area) when viewed in a front view. As the non-display area of display devices decreases, the display area of the display devices increases.

SUMMARY

The present disclosure provides a display device having a reduced bezel area and being deformed for a user's convenience.

The present disclosure provides a portable terminal.

Embodiments of the inventive concept provide a display device including a display panel including a first portion, a second portion extending from the first portion, and a third portion extending from the second portion and facing the first portion, a body inserted into between the first and third portions and coupled to the display panel in a first state or a second state or separated from the display panel, the body including a first surface, a second surface facing the first surface, a third surface connecting the first and second surfaces, and a fourth surface facing the third surface, a driver driving the display panel, and a printed circuit board applying a signal to the driver to drive the display panel. The display panel covers the first, second, and third surfaces of the body in the first state, and the display panel covers the first, second, and fourth surfaces of the body in the second state.

The display device further includes a cover coupled to the body and covering one of the third or fourth surfaces of the body, and the cover covers the fourth surface in the first state and covers the third surface in the second state.

The driver includes a gate driver applying a gate signal to gate lines arranged in each of the first, second, and third portions and a data driver applying a data signal to data lines arranged in each of the first, second, and third portions. The gate driver is located in the second portion and provides the gate signal to a direction toward the first portion from the second portion and to a direction toward the third portion from the second portion.

The printed circuit board is located in the body.

The display device further includes a first terminal located on a rear surface of the display panel, which makes contact with the body, and electrically connected to the driver and a second terminal electrically connected to the printed circuit board located in the body. The first terminal is electrically connected to the second terminal in a case where the display panel is coupled to the body in the first or second state.

One terminal of the first and second terminals has a protrusion shape and the other terminal of the first and second terminals has a concave recess shape in which the protrusion shape is accommodated.

The printed circuit board is located on a rear surface of the display panel, which makes contact with the body.

The display device further includes a flexible printed circuit board electrically connecting the driver and the printed circuit board and a cover member covering the printed circuit board attached to the rear surface of the display panel and the flexible printed circuit board.

The display device further includes a first connector provided on the printed circuit board and a second connector provided on the body. The cover member includes an opening formed therethrough to expose the first connector, and the first connector is electrically connected to the second connector in a case where the display panel is coupled to the body in the first or second state.

One of the display panel or the body includes a protrusion, the other of the display panel or the body includes an accommodating recess in which the protrusion is accommodated, and the protrusion is accommodated in the accommodating recess when the display panel is coupled to body.

The display device further includes a guide rail located on one of the display panel or the body, and the display panel and the body are coupled to each other in a sliding manner along the guide rail.

The first and third portions have a flat shape and the second portion has the flat shape or a curved shape.

Embodiments of the inventive concept provide a portable terminal including a display panel including a first portion, a second portion extending from the first portion, and a third portion extending from the second portion and facing the first portion and a body inserted into between the first and third portions and coupled to or separated from the display panel in a sliding manner. The display panel and the body are coupled to each other in a first state in which the display panel slides to a first direction and is coupled to the body or the display panel and the body are coupled to each other in a second state in which the display panel slides to a second direction opposite to the first direction and is coupled to the body.

The portable terminal further includes a protrusion located on one surface of a surface of the display panel, which makes contact with the body, and a surface of the body, which makes contact with the display panel. An accommodating recess is provided in the other surface of the surface of the display panel, which makes contact with the body, and the surface of the body, which makes contact with the display panel.

The portable terminal further includes a printed circuit board located in the body to output a signal to drive the display panel, and the printed circuit board applies the signal to the display panel through the protrusion and the accommodating recess when the display panel is coupled to the body.

The portable terminal further includes a printed circuit board located on a rear surface of the display panel and including a first connector and a graphic controller located in the body and electrically connected to a second connector exposed to an outside of the body. The first connector makes contact with and is electrically connected with the second connector when the display panel is coupled to the body.

The portable terminal further includes a gate driver located in the second portion of the display panel, and the gate driver applies a gate signal to gate lines arranged in each of the first, second, and third portions.

Embodiments of the inventive concept provide a display device including a display panel including a first portion, a second portion extending from the first portion, and a third portion extending from the second portion and facing the first portion, a gate driver located in the second portion to apply a gate signal to gate lines arranged in each of the first, second, and third portions, and a body surrounded by the first, second, and third portions of the display panel and coupled to the display panel. A first display area displaying an image of the first portion and a second display area displaying the image of the second portion are consecutively arranged, a non-display area of the second portion is located between the second display area and a third display area displaying the image of the third portion, and the gate driver is located in the non-display area.

The display panel is attachable to and detachable from the body, and the display panel slides in a first direction or a second direction opposite to the first direction to be coupled to the body.

One of the display panel or the body includes a protrusion, the other of the display panel or the body includes an accommodating recess in which the protrusion is accommodated, and the protrusion is accommodated in the accommodating recess when the display panel is coupled to body.

According to the above, the display panel may be coupled to the body in the first or second direction. Therefore, the user may easily change the coupling state between the display panel and the body in accordance with the user's convenience. In addition, the display panel includes the first, second, and third portions and the gate driver is located in the second portion and drives the first and third portions. Thus, the non-display area of the first and third portions may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

Hereinafter, the present invention will be explained in detail with reference to the accompanying drawings.

Figure 1:
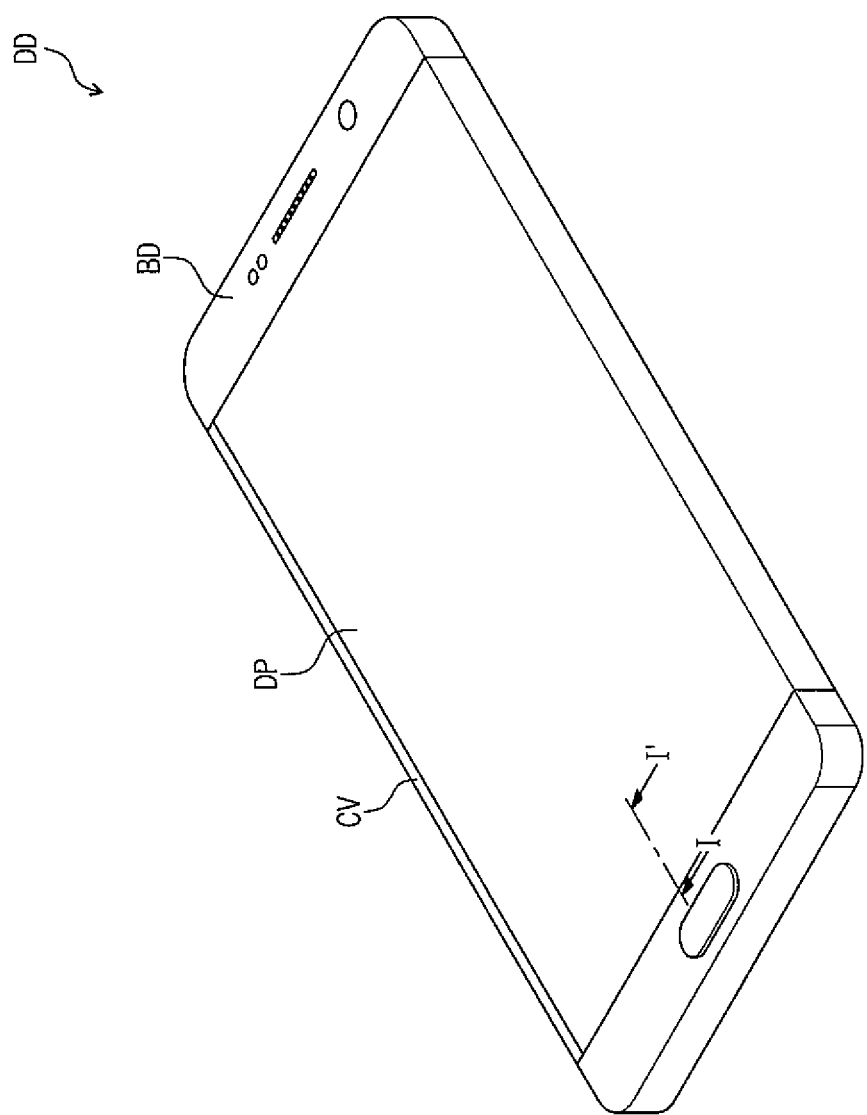
FIG. 1 is a perspective view showing a display device according to an exemplary embodiment of the present disclosure.

FIG. 1 is a perspective view showing a display device DD according to an exemplary embodiment of the present disclosure.

FIG. 1 shows a portable terminal as the display device DD, but the display device DD should not be limited to the portable terminal. For example, the display device DD according to the present exemplary embodiment may be applied to electronic devices, such as a personal digital assistant, a game unit, a portable electronic device, a tablet, etc.

The display device DD includes a display panel DP and a body BD. The display panel DP covers three surfaces of the body BD. As such, the display device DD includes three display surfaces. The display panel DP is separable from and couplable to the body BD. The display panel DP may be coupled to the body BD in two or more configurations as will be described in detail later.

Figure 2A:
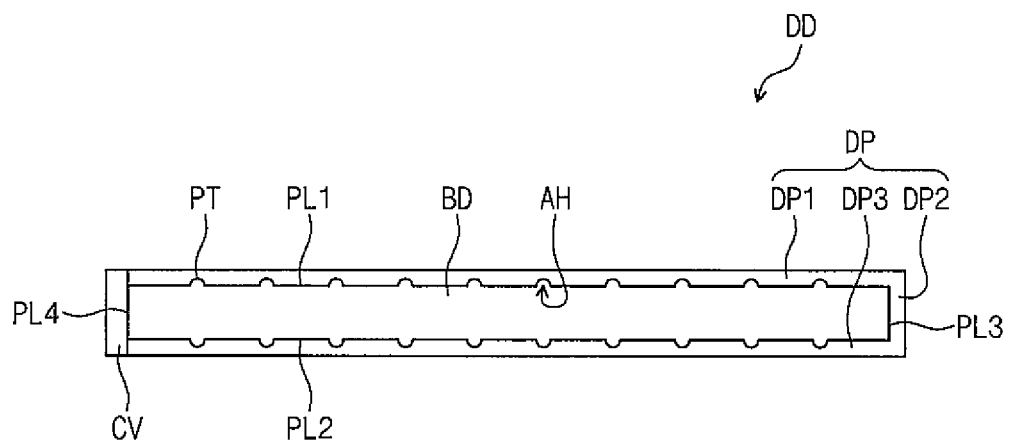
FIG. 2A is a cross-sectional view showing a display device according to an exemplary embodiment of the present disclosure.
Figure 2B:
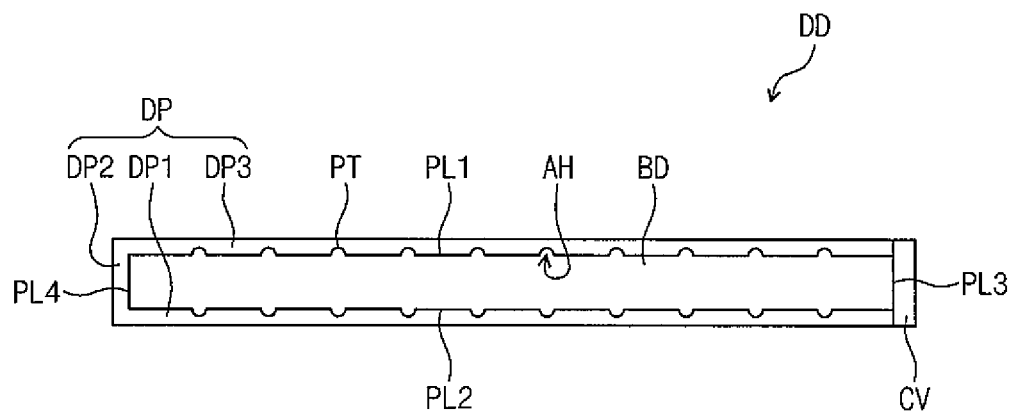
FIG. 2B is a cross-sectional view showing a display device according to an exemplary embodiment of the present disclosure.

FIG. 2A is a cross-sectional view showing a display device DD according to an exemplary embodiment of the present disclosure and FIG. 2B is a cross-sectional view showing the display device DD according to an exemplary embodiment of the present disclosure. FIG. 2A shows the cross-sectional view of the display device DD when the display panel DP is coupled to the body BD in a first state and FIG. 2B shows the cross-sectional view of the display device DD when the display panel DP is coupled to the body BD in a second state.

The display device DD includes a display panel DP, a body BD, and a cover CV.

The display panel DP includes a first portion DP1, a second portion DP2, and a third portion DP3. The second portion DP2 is bent from the first portion DP1 while extending from the first portion DP1 and the third portion DP3 is bent from the second portion DP2 while extending from the second portion DP2. The first portion DP1 and the third portion DP3 face each other. As will be appreciated, in this embodiment, a cross-section of the display panel DP is generally U-shaped.

The body BD includes a first surface PL1, a second surface PL2, a third surface PL3, and a fourth surface PL4. The first and second surfaces PL1 and PL2 face each other and the third and fourth surfaces PL3 and PL4 face each other. The third surface PL3 extends from one end of the first surface PL1 to one end of the second surface PL2 to connect the first surface PL1 to the second surface PL2. The fourth surface PL4 extends from the other end of the first surface PL1 to the other end of the second surface PL2 to connect the first surface PL1 to the second surface PL2.

The cover CV covers one of portions of the third or fourth surfaces PL3 and PL4, which are not covered by the display panel DP.

Referring to FIG. 2A, the display panel DP is coupled to the body BD in the first state. As shown, the display panel DP covers the first, second, and third surfaces PL1, PL2, and PL3 of the body BD. The first portion DP1 is located on the first surface PL1, the second portion DP2 is located on the third surface PL3, and the third portion DP3 is located on the second surface PL2. The cover CV is located on the fourth surface PL4.

Referring to FIG. 2B, the display panel DP is coupled to the body BD in the second state. As shown, the display panel DP covers the first, second, and fourth surfaces PL1, PL2, and PL4 of the body BD. The first portion DP1 is located on the first surface PL1, the second portion DP2 is located on the fourth surface PL4, and the third portion DP3 is located on the second surface PL2. The cover CV is located on the third surface PL3.

The display panel DP is attachable to and detachable from the body BD. Accordingly, a user who uses the display device DD may couple the display panel DP to the body BD in the first or second state in accordance with the user's convenience. For instance, when the user is a right-handed person, the display panel DP and the body BD can be coupled to each other in the first state, i.e., the state shown in FIG. 2A, and when the user is a left-handed person, the display panel DP and the body BD can be coupled to each other in the second state, i.e., the state shown in FIG. 2B. However, the coupling state of the display panel DP and the body BD are not limited to the above-mentioned states.

One of the display panel DP or the body BD is provided with a protrusion PT thereon and the other of the display panel DP or the body BD is provided with an accommodating recess AH in which the protrusion PT is accommodated. In FIGS. 2A and 2B, the protrusion PT is provided on the surface of the body BD that contacts the display panel DP, and the accommodating recess AH is provided on the surface of the display panel DP that contacts the body BD. Each of the protrusion PT and the accommodating recess AH may be provided as a plurality. When the body BD is coupled to the display panel DP, the protrusions PT are accommodated in the accommodating recesses AH in a one-to-one correspondence. Different from the present exemplary embodiment, the protrusions PT may be provided on the display panel DP and the accommodating recess AH may be provided in the body BD. In addition, according to another embodiment of the present disclosure, the protrusions PT and the accommodating recesses AH may be provided on each of the body BD and the display panel DP. In this case, the accommodating recesses AH may be provided in areas of the body BD which face the protrusions PT of the display panel DP, and the protrusions PT may be provided in areas of the body BD which face the accommodating recesses AH of the display panel DP.

Figure 3A:
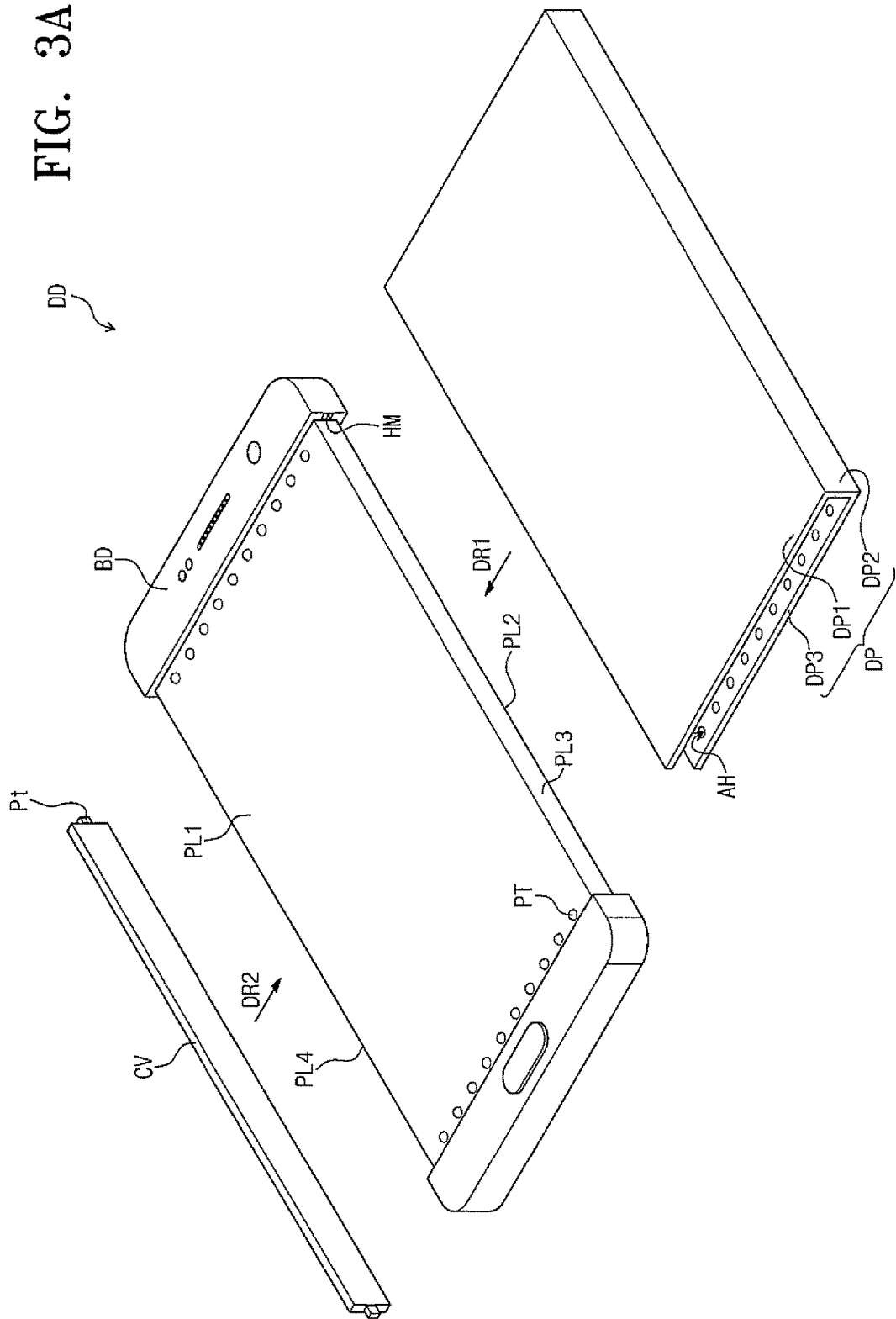
FIG. 3A is an exploded perspective view showing a display device according to an exemplary embodiment of the present disclosure.
Figure 3B:
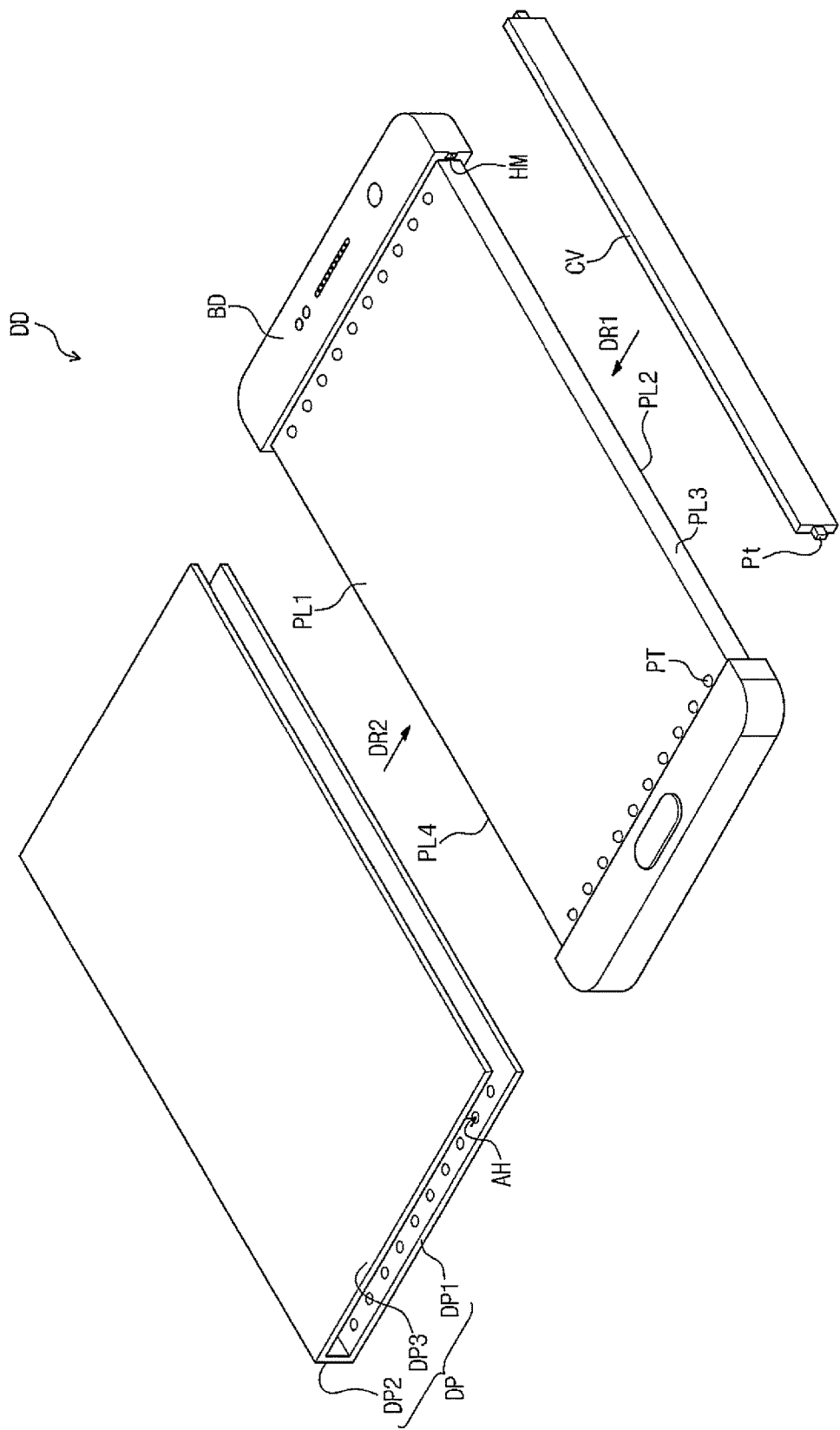
FIG. 3B is an exploded perspective view showing a display device according to an exemplary embodiment of the present disclosure.

FIG. 3A is an exploded perspective view showing the display device DD according to an exemplary embodiment of the present disclosure and FIG. 3B is an exploded perspective view showing the display device DD according to an exemplary embodiment of the present disclosure.

FIG. 3A shows the exploded perspective view of the display device DD in the first state shown in FIG. 2A and FIG. 3B shows the exploded perspective view of the display device DD in the second state shown in FIG. 2B.

Referring to FIG. 3A, the display panel DP is slidable in a first direction DR1 toward the body BD, and thus is coupled to the body BD. The display panel DP is coupled to the body BD and covers the first, second, and third surfaces PL1, PL2, and PL3.

The cover CV is coupled to the body BD and covers the fourth surface PL4. In one embodiment, a protrusion Pt is located at both ends of the cover CV. The body BD is provided with a concave portion HM in which the protrusion Pt is accommodated. The protrusion Pt is accommodated in the concave portion HM so that the cover CV is coupled to the body BD, but it should not be limited thereto or thereby. According to another embodiment of the present disclosure, the protrusion Pt and the concave portion HM may be omitted. In this case, in order to attach the cover CV to the body BD, for example, the body BD may include a metal material and the cover CV may include a magnetic material.

Referring to FIG. 3B, the display panel DP is slidable in a second direction DR2 towards the body BD, and thus is coupled to the body BD. The second direction DR2 is opposite to the first direction DR1. The display panel DP covers the first, second, and fourth surfaces PL1, PL2, and PL4 and is coupled to the body BD.

According to the present exemplary embodiment, the user who uses the display device DD may separate the display panel DP from the body BD and the user may couple the display panel DP to the body BD along a desired direction.

Figure 4:
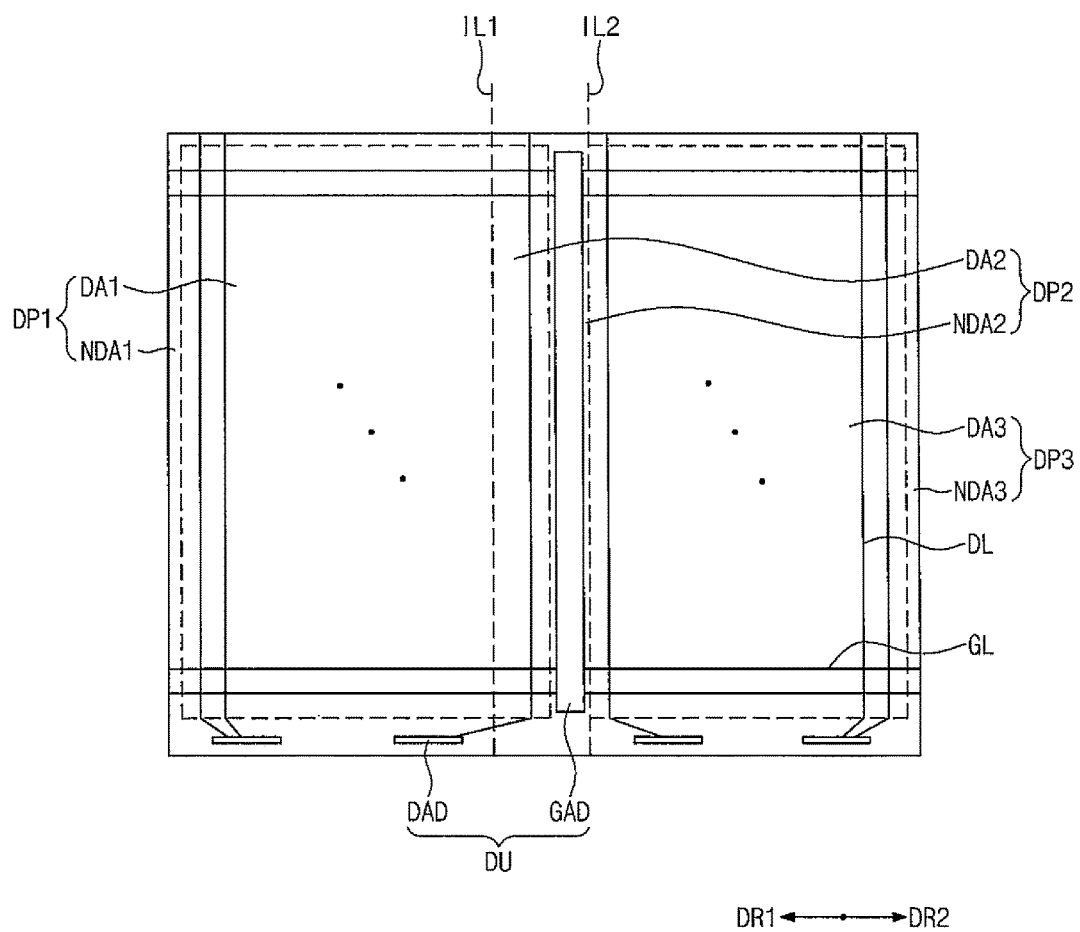
FIG. 4 is a plan view showing a display device according to an exemplary embodiment of the present disclosure.

FIG. 4 is a plan view showing a display device according to an exemplary embodiment of the present disclosure.

For the convenience of explanation, FIG. 4 shows the display panel DP in an unfolded state. The display panel DP shown in FIG. 4 may be bent with respect to two imaginary lines IL1 and IL2, and thus the display panel DP may have the shape shown in FIG. 3A.

The first portion DP1 includes a first display area DA1 for displaying an image and a first non-display area NDA1. The second portion DP2 includes a second display area DA2 for displaying the image and a second non-display area NDA2. The third portion DP3 includes a third display area DA3 for displaying the image and a third non-display area NDA3. The first and second display areas DA1 and DA2 are consecutively arranged and the second non-display area NDA2 is located between the second and third display areas DA2 and DA3.

The display panel DP includes a driver DU located thereon. The driver DU includes a gate driver GAD configured to apply gate signals to gate lines GL arranged in each of the first, second, and third portions DP1, DP2, and DP3 and a data driver configured to apply data signals to data lines DL arranged in each of the first, second, and third portions DP1, DP2, and DP3.

The gate driver GAD is located in the second non-display area NDA2 to output the gate signals to the first, second, and third display areas DA1, DA2, and DA3 along both directions. For instance, the gate driver GAD outputs the gate signals to the gate line GL extending toward the first portion DP1 from the gate driver GAD along the first direction DR1 and the gate line GL extending toward the third portion DP3 from the gate driver GAD along the second direction DR2.

According to the present exemplary embodiment, the gate driver GAD applying the gate signals to the first and third portions DP1 and DP3 is located in the second non-display area NDA2 of the second portion DP2. Accordingly, as the display device DD shown in FIG. 1, the non-display area may be absent in areas of the first and third portions DP1 and DP3 of the display panel DP, which are adjacent to the second portion DP2. Therefore, the non-display area of the first and third portions DP1 and DP3 is reduced, and thus a bezel area of the display panel DP is reduced.

In FIG. 4, the gate driver GAD is located adjacent to the third portion DP3, but it is not limited thereto or thereby. For instance, the gate driver GAD may be located at a center of the second portion DP2 according to another embodiment of the present disclosure.

The data driver DAD is provided in the first and third non-display areas NDA1 and NDA3 in a driving chip. FIG. 4 shows four driving chips, but the number of the driving chips is not limited to four.

The data driver DAD located in the first non-display area NDA1 applies the data signals to the data lines DL arranged in the first and second display areas DA1 and DA2, and the data driver DAD located in the third non-display area NDA3 applies the data signals to the data lines DL arranged in the third display area DA3.

Figure 5:
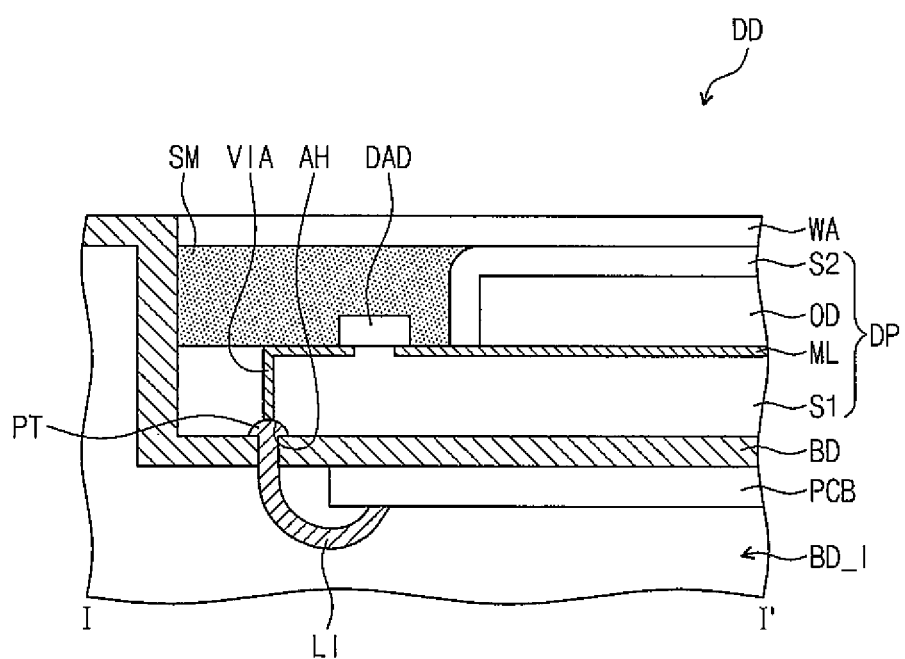
FIG. 5 is an enlarged view showing a portion of a display device according to an exemplary embodiment of the present disclosure.

FIG. 5 is an enlarged view showing a portion of a display device according to an exemplary embodiment of the present disclosure. In detail, FIG. 5 shows a cross-sectional view taken along a line I-I' of FIG. 1.

Referring to FIG. 5, the display panel DP includes a first substrate S1, a metal layer ML, an organic light emitting diode layer OD, and a sealing layer S2.

The metal layer ML is located on the first substrate S1 and may be provided as a plurality. For example, FIG. 5 shows the portion of the data line DL (refer to FIG. 4) in the metal layer ML, but the metal layer ML may include the gate line GL (refer to FIG. 4) insulated from the data line DL (FIG. 4) and thin film transistors used to drive each pixel.

The organic light emitting diode layer OD is located on the metal layer ML. The organic light emitting diode layer OD includes a light emitting material. The organic light emitting diode layer OD generates a light having a color corresponding to the light emitting material. The color light generated by the organic light emitting diode layer OD may have a red, green, blue, or white color, but is not limited thereto.

The sealing layer S2 covers the organic light emitting diode layer OD and protects the organic light emitting diode layer OD from air and moisture. The sealing layer S2 includes a thin film encapsulation layer, i.e., a plurality of inorganic thin film layers and a plurality of organic thin film layers. In the present exemplary embodiment, the sealing layer S2 may be replaced with a sealing substrate. The sealing substrate is spaced from the first substrate S1 such that the organic light emitting diode layer OD is located between the sealing substrate and the first substrate S1. The sealing substrate may be coupled to the first substrate S1 by a sealant provided along an edge of the first substrate S1.

A window assembly WA is located on the display panel DP. In the present exemplary embodiment, the window assembly WA includes a window member and a touch panel.

In one embodiment, the window member includes a base member and a black matrix. The base member includes a silicon substrate, a glass substrate, a sapphire substrate, or a plastic film, but is not limited thereto. The black matrix is located on a rear surface of the base member to define the bezel area, i.e., the non-display area, of the display device DD. In one embodiment, the black matrix is formed using a colored organic layer by a coating method. In addition, the window member may further include a functional coating layer located on an entire surface of the base member. The functional coating layer may include an anti-fingerprint layer, an anti-reflection layer, a hard coating layer.

The touch panel is configured to obtain coordinate information of an input position. The touch panel is located on an upper surface of the display panel DP. The position of the touch panel should not be limited thereto or thereby, and a touch electrode of the touch panel may be located between the sealing layer S2 and the organic light emitting diode layer OD. The touch panel is classified into a resistive film type of touch panel, an electrostatic capacitive type of touch panel, an electromagnetic induction type of touch panel. In the present exemplary embodiment, the touch panel may be, but not limited to, an electrostatic capacitive type touch panel. In one embodiment, the touch panel includes two kinds of sensors crossing each other. The electrostatic capacitive type touch panel is configured to obtain the coordinate information of the touch position using a self-capacitance manner or a mutual capacitance manner.

A printed circuit board PCB is located in an inner portion BD_I of the body BD. The printed circuit board PCB applies a signal to the driver DU (refer to FIG. 4) to drive the display panel DP.

The printed circuit board PCB and the driver DU (refer to FIG. 4) are electrically connected to each other by the protrusion PT and the accommodating recess AH. FIG. 5 shows a portion in which the printed circuit board PCB is electrically connected to the data driver DAD.

The accommodating recess AH is located at the rear surface of the display panel DP and electrically connected to the driver DU (refer to FIG. 4) via a through hole filled with a metal material VIA. The protrusion PT is electrically connected to the printed circuit board PCB through a line LI. In other words, the accommodating recess AH serves as a first terminal electrically connected to the display panel DP and the protrusion PT serves as a second terminal electrically connected to the printed circuit board PCB. According to the present exemplary embodiment, since the accommodating recess AH and the protrusion PT serve as terminals, the number of the protrusions PT and the number of the accommodating recesses AH are determined depending on the number of the terminals.

The display device DD may further include an adhesive member SM located between the area in which the data driver DAD is located and the window assembly WA. The adhesive member SM may be, but not limited to, an adhesive tape or a curable resin. The adhesive member SM covers the data driver DAD provided in the driving chip and compensates for a step difference between the window assembly WA and the display panel DR. According to embodiment, the adhesive member SM may be omitted.

Figure 6:
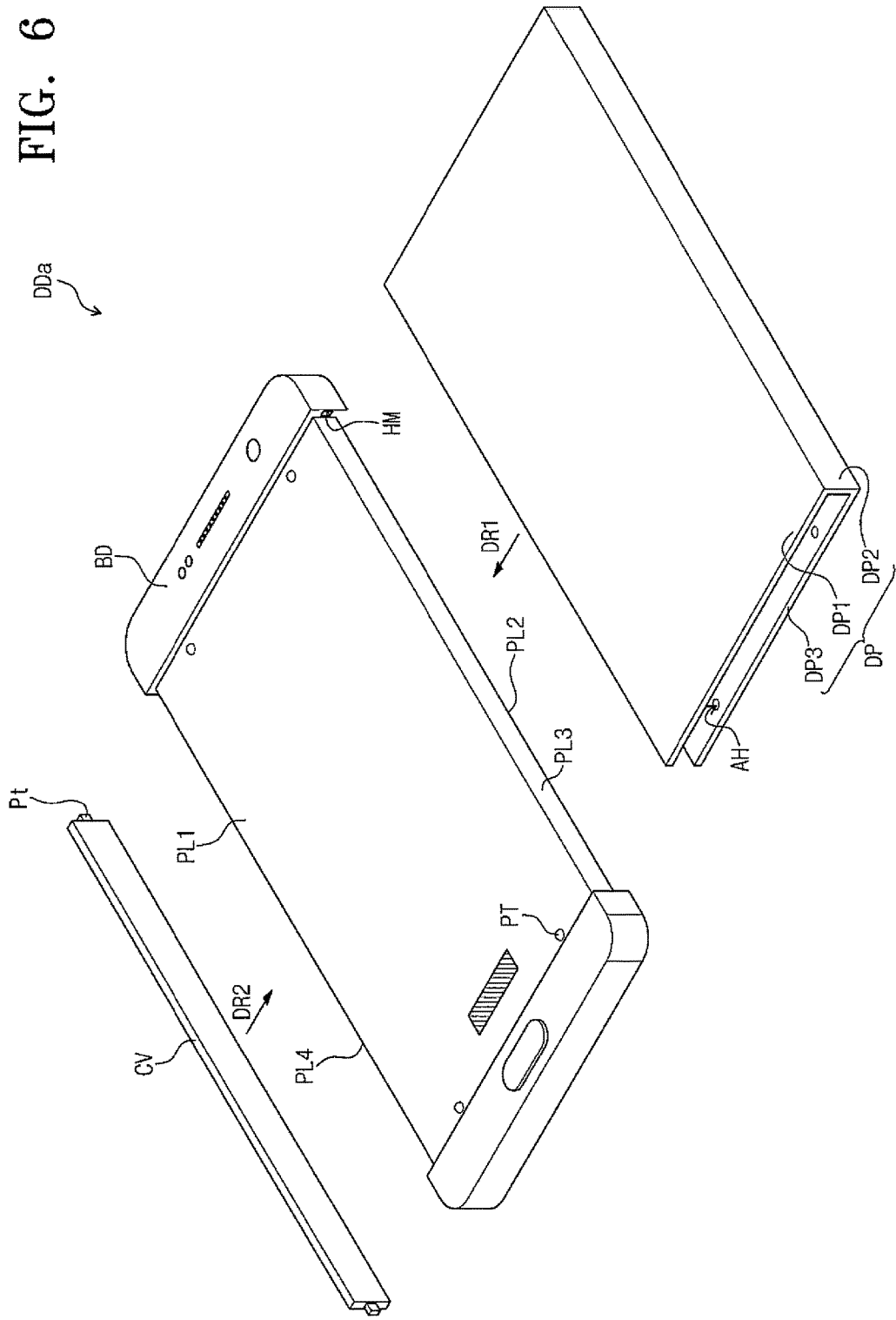
FIG. 6 is an exploded perspective view showing a display device according to an exemplary embodiment of the present disclosure.
Figure 7:
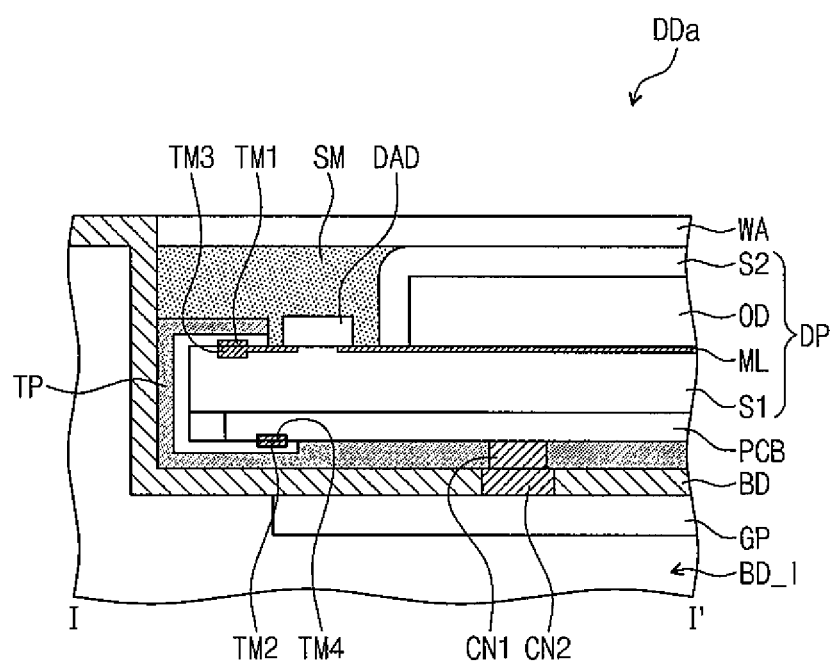
FIG. 7 is an enlarged view showing a portion of a display device according to an exemplary embodiment of the present disclosure.

FIG. 6 is an exploded perspective view showing a display device DDa according to an exemplary embodiment of the present disclosure and FIG. 7 is an enlarged view showing a portion of the display device DDa according to an exemplary embodiment of the present disclosure. In detail, FIG. 7 shows the cross-sectional view taken along a line I-I' of FIG. 1.

Referring to FIGS. 6 and 7, the display device DDa has the same structure and functions as those of the display device DD shown in FIG. 5 except for the position of the printed circuit board PCB.

The printed circuit board PCB is located on the rear surface of the display panel DP. Accordingly, the display device DDa may further include a flexible printed circuit board FPC to electrically connect the printed circuit board PCB located on the rear surface of the display device DDa and the driver DU (refer to FIG. 2).

The flexible printed circuit board FPC includes a first terminal TM1 and a second terminal TM2. The first terminal TM1 is electrically connected to a terminal TM3 provided on the display panel DP and the second terminal TM2 is electrically connected to a fourth terminal TM4 provided on the printed circuit board PCB. The first terminal TM1 and the terminal TM3 of the display panel DP may be connected to each other by an anisotropic conductive film (ACF) and the second terminal TM2 and the terminal TM4 of the display panel DP may be connected to each other by the anisotropic conductive film (ACF). The anisotropic conductive film includes fine conductive particles, such as nickel, carbon, or lead, and an insulating adhesive agent.

The display device DDa may further include a cover member TP to cover the printed circuit board PCB and the flexible printed circuit board FPC. The cover member TP covers the printed circuit board PCB and the flexible printed circuit board FPC to prevent the printed circuit board PCB and the flexible printed circuit board FPC from being damaged when the display panel DP is separated from and coupled to the body BD. The cover member TP may be a black tape. The cover member TP includes an opening formed therethrough to expose a first connector CN1 provided on the printed circuit board PCB.

A graphic controller GP is located in the inner portion BD_1 of the body BD. The graphic controller GP includes a central processing unit generating image data and a control signal controlling the driver DU (refer to FIG. 4). The graphic controller GP applies the image data and the control signal to the printed circuit board PCB through a second connector CN2. The second connector CN2 is exposed to the outside of the body BD. When the display panel DP and the body BD are coupled to each other, the first connector CN1 and the second connector CN2 may be electrically connected to each other.

Different from the description with reference to FIG. 5, the protrusion PT and the accommodating recess AH prevents the display panel DP from being separated from the body BD without serving as the terminals. Accordingly, the number and position of the protrusions PT and the accommodating recesses AH may be changed regardless of the electrical connection.

Figure 8:
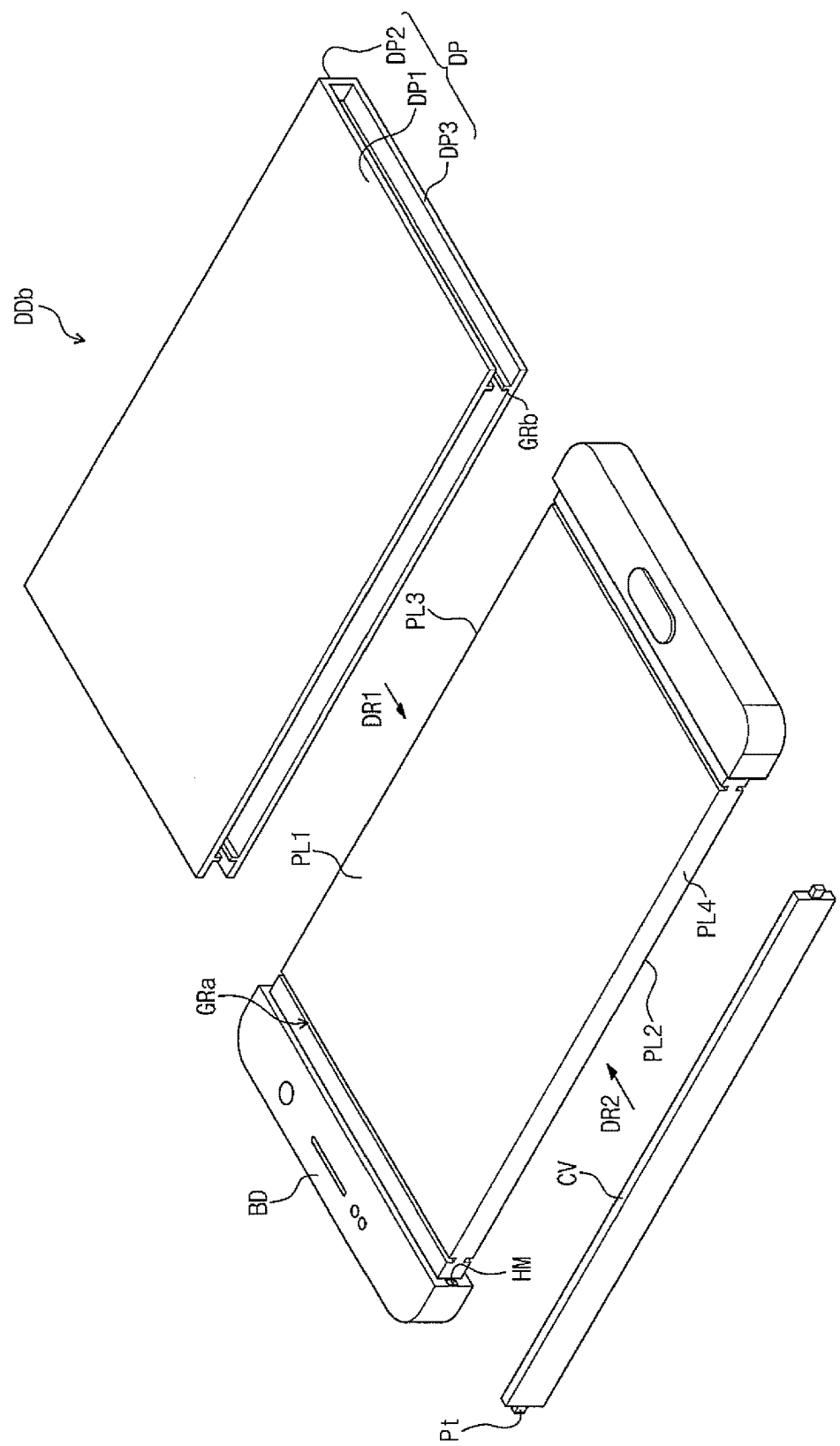
FIG. 8 is an exploded perspective view showing a display device according to an exemplary embodiment of the present disclosure.

FIG. 8 is an exploded perspective view showing a display device DDb according to an exemplary embodiment of the present disclosure.

Referring to FIG. 8, the display device DDb includes a guide rail GRa located on one of the display panel DP or the body BD.

FIG. 8 shows the guide rail GRa located on the body BD. In this case, the display panel DP may include a protrusion GRb accommodated in the guide rail GRa. The protrusion GRb may be located on the rear surface of the display panel DP which is configured to contact the body BD.

In the present exemplary embodiment, two guide rails GRa are located on each of the first surface PL1 and the second surface PL2 of the body BD, but the number of the guide rails GRa is not limited thereto. Further, the number of the protrusions GRb may be changed to correspond to the number of the guide rail GRa.

Figure 9:
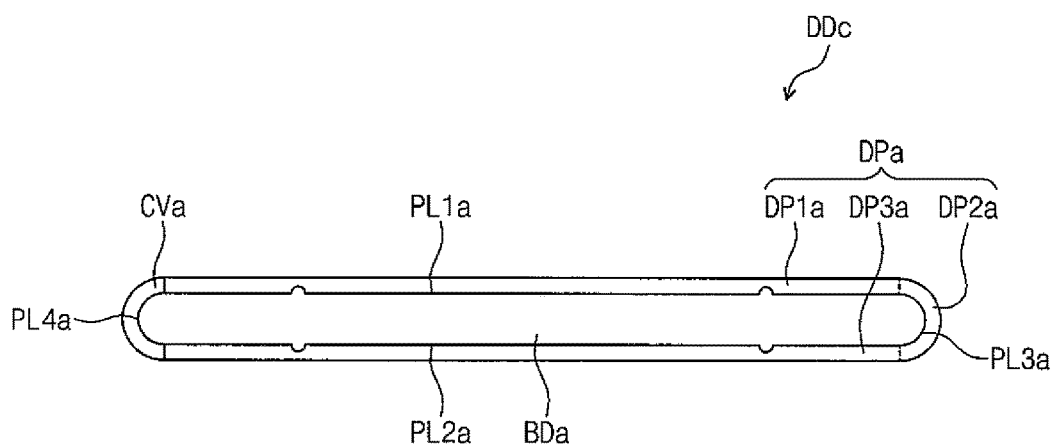
FIG. 9 is a cross-sectional view showing a display device according to an exemplary embodiment of the present disclosure.

FIG. 9 is a cross-sectional view showing a display device DDc according to an exemplary embodiment of the present disclosure.

Referring to FIG. 9, the display device DDc has the same structure and function as those of the display device DD described with reference to FIG. 2A except for a body BDa and a display panel DPa. For instance, the second portion DP2 of the display panel DP shown in FIG. 2A has a flat shape, but a second portion DP2a of the display panel DPa shown in FIG. 9 has a curved shape.

The display panel DPa includes a first portion DP1a that is flat, the second portion DP2a extending from the first portion DP1a and having the curved shape, and a third portion DP3a extending from the second portion DP2a and having the flat shape. To correspond to the shape of the display panel DPa, the body BDa includes a first surface PL1a that is flat, a second surface PL2a that is flat and faces the first surface PL1a, a third surface PL3a connecting the first and second surfaces PL1a and PL2a and having a curved shape, and a fourth surface PL4a facing the third surface PL3a and having the curved shape.

A cover CVa covers one surface of the third and fourth surfaces PL3a or PL4a, which is not covered by the display panel DPa. Accordingly, the cover CVa has the curved shape corresponding to the shape of the third and fourth surfaces PL3a and PL4a.

The display panel DPa and the cover CVa are attachable to and detachable from the body BDa. Therefore, the user who uses the display device DDc may change positions of the display panel DPa and the cover CVa in accordance with the user's convenience. For instance, the second portion DP2a of the display panel DP covers the third surface PL3a of the body BDa and the cover CVa covers the fourth surface PL4a of the body BDa in the first state. In addition, the second portion DP2a of the display panel DP covers the fourth surface PL4a of the body BDa and the cover CVa covers the third surface PL3a of the body BDa in the second state.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
   a display panel comprising a first portion, a second portion extending from the first portion, and a third portion extending from the second portion and facing the first portion, at least one of the first portion, the second portion, and the third portion comprising a display area configured to display an image;
   a body configured to be located between the first and third portions and being configured to be separably coupled to the display panel in a first state, being configured to be separably coupled to the display panel in a second state, and being configured to be separated from each of the first portion, the second portion, and the third portion of the display panel, the body comprising a first surface, a second surface facing the first surface, a third surface connecting the first and second surfaces, and a fourth surface facing the third surface;
   a driver configured to drive the display panel; and
   a printed circuit board configured to apply a signal to the driver to drive the display panel, wherein the display panel covers the first, second, and third surfaces of the body in the first state, and wherein the display panel covers the first, second, and fourth surfaces of the body in the second state.

2. The display device of claim 1 further comprising a cover coupled to the body and covering one of the third or fourth surfaces of the body, wherein the cover covers the fourth surface in the first state and covers the third surface in the second state.

3. The display device of claim 1, wherein the driver comprises:
a gate driver configured to apply a gate signal to gate lines arranged in each of the first, second, and third portions; and
a data driver configured to apply a data signal to data lines arranged in each of the first, second, and third portions, and wherein the gate driver is located in the second portion and is configured to provide the gate signal in a direction toward the first portion from the second portion and in a direction toward the third portion from the second portion.

4. The display device of claim 1, wherein the printed circuit board is located in the body.

5. The display device of claim 4, further comprising:
a first terminal located on a rear surface of the display panel, the first terminal contacting the body, and being electrically connected to the driver; and
a second terminal electrically connected to the printed circuit board located in the body, wherein the first terminal is electrically connected to the second terminal when the display panel is coupled to the body in the first or second state.

6. The display device of claim 5, wherein one terminal of the first and second terminals is a protrusion and the other terminal of the first and second terminals has a concave recess configured to accommodate the protrusion.

7. The display device of claim 1 wherein the printed circuit board is located on a rear surface of the display panel and is configured to contact the body.

8. The display device of claim 7 further comprising:
a flexible printed circuit board electrically connecting the driver and the printed circuit board; and
a cover member covering the printed circuit board attached to the rear surface of the display panel and the flexible printed circuit board.

9. The display device of claim 8 further comprising:
a first connector provided on the printed circuit board; and
a second connector provided on the body, wherein the cover member has an opening to expose the first connector, and wherein the first connector is electrically connected to the second connector when the display panel is coupled to the body in the first or second state.

10. The display device of claim 1, wherein one of the display panel or the body comprises a protrusion, the other of the display panel or the body comprises an accommodating recess in which the protrusion is configured to be accommodated, and wherein the protrusion is accommodated in the accommodating recess when the display panel is coupled to the body.

11. The display device of claim 1 further comprising a guide rail located on one of the display panel or the body, wherein the display panel and the body are coupled to each other in a sliding manner along the guide rail.

12. The display device of claim 1, wherein the first and third portions are flat and the second portion is flat or curved.

13. A portable terminal comprising:
a display panel comprising a first portion, a second portion extending from the first portion, and a third portion extending from the second portion and facing the first portion, at least two of the first portion, the second portion, and the third portion comprising a display area configured to display an image; and
a body slidably insertable between the first and third portions, wherein the display panel and the body are configured to be separably coupled to each other in which the display panel is configured to slide in a first direction to be coupled to the body in a first state and is configured to slide in a second direction opposite to the first direction to be coupled to the body in a second state.

14. The portable terminal of claim 13 further comprising a protrusion located on at least one of a surface of the display panel which contacts the body, or a surface of the body which contacts the display panel, and wherein an accommodating recess for a respective protrusion is provided in another surface of the surface of the display panel which contacts the body, or another surface of the body which contacts the display panel.

15. The portable terminal of claim 14, further comprising a printed circuit board located in the body and configured to output a signal to drive the display panel, wherein the printed circuit board is configured to apply the signal to the display panel through the protrusion and the accommodating recess when the display panel is coupled to the body.

16. The portable terminal of claim 13 further comprising:
a printed circuit board located on a rear surface of the display panel and comprising a first connector; and
a graphic controller located in the body and electrically connected to a second connector exposed from the body, wherein the first connector contacts and is electrically connected with the second connector when the display panel is coupled to the body.

17. The portable terminal of claim 13, further comprising a gate driver located in the second portion of the display panel, wherein the gate driver is configured to apply a gate signal to gate lines arranged in each of the first, second, and third portions.

18. A display device comprising:
a display panel comprising a first portion, a second portion extending from the first portion, and a third portion extending from the second portion and facing the first portion;
a gate driver located in the second portion and configured to apply a gate signal to gate lines arranged in each of the first, second, and third portions; and
a body surrounded by the first, second, and third portions of the display panel and configured to be coupled to the display panel, wherein a first display area configured to display an image on the first portion and a second display area configured to display an image on the second portion are consecutively arranged, wherein a non-display area of the second portion is located between the second display area and a third display area configured to display an image on the third portion, and wherein the gate driver is located in the non-display area,
wherein the display panel is attachable to and detachable from the body, and wherein the display panel is configured to slide in a first direction or a second direction opposite to the first direction to be coupled to the body.

19. The display device of claim 18, wherein one of the display panel or the body comprises a protrusion, wherein the other of the display panel or the body comprises an accommodating recess in which the protrusion is configured to be accommodated when the display panel is coupled to the body.

* * * * *